(12) United States Patent
Firnkes et al.

(10) Patent No.: US 8,963,083 B2
(45) Date of Patent: Feb. 24, 2015

(54) SWITCHABLE MULTI PERSPECTIVE DETECTOR, OPTICS THEREFORE AND METHOD OF OPERATING THEREOF

(71) Applicants: Matthias Firnkes, Walpertskirchen (DE); Stefan Lanio, Erding (DE); Gerald Schönecker, Munich (DE); Dieter Winkler, Munich (DE)

(72) Inventors: Matthias Firnkes, Walpertskirchen (DE); Stefan Lanio, Erding (DE); Gerald Schönecker, Munich (DE); Dieter Winkler, Munich (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 0 days.

(21) Appl. No.: 13/960,393

(22) Filed: Aug. 6, 2013

(65) Prior Publication Data

US 2015/0021474 A1    Jan. 22, 2015

(30) Foreign Application Priority Data

Jul. 19, 2013  (EP) .................................... 13177207

(51) Int. Cl.
| | |
|---|---|
| *H01J 37/26* | (2006.01) |
| *H01J 37/21* | (2006.01) |
| *H01J 37/10* | (2006.01) |
| *H01J 37/147* | (2006.01) |

(52) U.S. Cl.
CPC ................. *H01J 37/21* (2013.01); *H01J 37/10* (2013.01); *H01J 37/147* (2013.01)
USPC .................. 250/306; 250/310; 250/396 R

(58) Field of Classification Search
CPC ........................................................ G21K 5/08
USPC .................................................. 250/306, 288
See application file for complete search history.

(56) References Cited

U.S. PATENT DOCUMENTS

| | | | | |
|---|---|---|---|---|
| 4,638,212 | A * | 1/1987 | Nakamura | 313/408 |
| 5,892,224 | A | 4/1999 | Nakasuji | |
| 6,593,152 | B2 * | 7/2003 | Nakasuji et al. | 438/14 |
| 2013/0270438 | A1 * | 10/2013 | Lanio et al. | 250/310 |

FOREIGN PATENT DOCUMENTS

EP    2654069 A1    10/2013

OTHER PUBLICATIONS

European Patent Office; Extended European Search Report for Application No. 13177207.1; 6 pages; Jan. 8, 2014.

* cited by examiner

*Primary Examiner* — Phillip A Johnston
(74) *Attorney, Agent, or Firm* — Patterson & Sheridan LLP

(57) ABSTRACT

A secondary charged particle detection device for detection of a signal beam is described. The device includes a detector arrangement having at least two detection elements with active detection areas, wherein the active detection areas are separated by a gap (G), a particle optics configured for separating the signal beam into a first portion of the signal beam and into at least one second portion of the signal beam, and configured for focusing the first portion of the signal beam and the at least one second portion of the signal beam. The particle optics includes an aperture plate and at least a first inner aperture openings in the aperture plate, and at least one second radially outer aperture opening in the aperture plate, wherein the first aperture opening has a concave shaped portion, particularly wherein the first aperture opening has a pincushion shape.

20 Claims, 13 Drawing Sheets

US 8,963,083 B2

SWITCHABLE MULTI PERSPECTIVE DETECTOR, OPTICS THEREFORE AND METHOD OF OPERATING THEREOF

FIELD

Embodiments of the invention relate to charged particle beam devices, for example, for inspection system applications, testing system applications, lithography system applications, defect review or critical dimensioning applications or the like. It also relates to methods of operation thereof. Further, embodiments of the invention relates to applications having a charged particle path for secondary particles, e.g. for electron beam inspection (EBI). Specifically, embodiment of the invention relates to charged particle units, to charged particle detection devices, a charged particle beam device, a charged particle multi-beam device and methods of operating theses devices.

BACKGROUND

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Besides resolution, throughput is an issue of such devices. Since large substrate areas have to be patterned or inspected, throughput of, for example, larger than 10 cm$^2$/min is desirable. In charged particle beam device, the throughput depends quadratically on the image contrast. Thus, there is a need for contrast enhancement.

Particle detectors, e.g. electron detectors, for particle beam systems, e.g. electron microscopes can be used for electron beam inspection (EBI), defect review (DR) or critical dimension (CD) measurement, focused ion Beam systems (FIB) or the like. Upon irradiation of a sample by a primary beam of electrons, secondary particles, e.g. secondary electrons (SE), are created, which carry information about the topography of the sample, its chemical constituents, its electrostatic potential and others. In the simplest detectors, all of the SE are collected and lead to a sensor, usually a scintillator, a pin diode or the like. An image is created where the gray level is proportional to the number of electrons collected.

High resolution electron optics systems require a short working distance between the objective lens and the wafer. Secondary electron collection is therefore typically done inside the column above the objective lens. A configuration commonly found in prior-art electron-beam imaging systems is shown schematically in FIG. 1. A column with length 104, including an emitter 105, an objective lens 10 and an annular secondary-electron detector 115, are spaced at a working distance 120 from a specimen 125. Primary electron beam 130 from emitter 105 is directed at specimen 125 through an opening 135 in annular detector 115. Secondary electrons 140 are emitted from specimen 125 in a broad cone surrounding primary beam 130. Some of secondary electrons 140 are collected by detector 115 to produce a secondary-electron (SE) signal 145.

Further, it is desired for many applications that the imaging information is increased while high-speed detection is provided. For example, upon irradiation of a sample by a primary beam of electrons, secondary electrons (SE) are created which carry information about the topography of the sample, its chemical constituents, its electrostatic potential and others. High speed detection provided with topography information and/or information on the energy of the secondary particles is a challenging task, for which continuous improvement is desired. Accordingly, improvements of the detection in the SEM-based tools, particularly in high throughput defect inspection or review tools are desired. Additionally or alternatively, separation of several signal beam bundles, e.g. with reduced cross-talk, is desired for detection of topography imaging or the like.

SUMMARY

According to one embodiment, a secondary charged particle detection device for detection of a signal beam is provided. The device includes a detector arrangement having at least two detection elements with active detection areas, wherein the active detection areas are separated by a gap, a particle optics configured for separating the signal beam into a first portion of the signal beam and into at least one second portion of the signal beam, and configured for focusing the first portion of the signal beam and the at least one second portion of the signal beam. The particle optics includes an aperture plate and at least a first aperture opening in the aperture plate, and at least one second aperture opening in the aperture plate, wherein the first aperture opening has a concave shaped portion.

According to another embodiment, a charged particle beam device is provided. The device includes a charged particle beam source for providing a primary charged particle beam, a first focusing element for focusing the primary charged particle beam on the specimen, wherein a signal beam is generated, and a charged particle detection device. The detection device includes a detector arrangement having at least two detection elements with active detection areas, wherein the active detection areas are separated by a gap, a particle optics configured for separating the signal beam into a first portion of the signal beam and into at least one second portion of the signal beam, and configured for focusing the first portion of the signal beam and the at least one second portion of the signal beam. The particle optics includes an aperture plate and at least a first aperture opening in the aperture plate, and at least one second aperture opening in the aperture plate, wherein the first aperture opening has a concave shaped portion.

According to a further embodiment, charged particle multi-beam device is provided. The charged particle multi-beam device includes at least two charged particle beam devices. Each of the two devices includes a charged particle beam source for providing a primary charged particle beam, a first focusing element for focusing the primary charged particle beam on the specimen, wherein a signal beam is generated, and a charged particle detection device. The detection device includes a detector arrangement having at least two detection elements with active detection areas, wherein the active detection areas are separated by a gap, a particle optics configured for separating the signal beam into a first portion of the signal beam and into at least one second portion of the signal beam, and configured for focusing the first portion of the signal beam and the at least one second portion of the signal beam. The particle optics includes an aperture plate and at least a first aperture opening in the aperture plate, and at least one second aperture opening in the aperture plate, wherein the first aperture opening has a concave shaped portion.

According to another embodiment, a method of operating a detection device is provided. The method includes biasing an aperture plate of a particle optics, wherein the particle optics includes at least a first aperture opening (202) in the aperture plate, and at least one second aperture opening in the aperture plate, wherein the aperture plate is biased such that one potential is surrounding the first aperture opening and wherein the first aperture opening has a concave shaped portion, and detecting a signal beam with a detector assembly having at least one detection element corresponding to the first aperture opening and at least one detection element corresponding to the at least one second aperture opening.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE DRAWINGS

Figure 1:
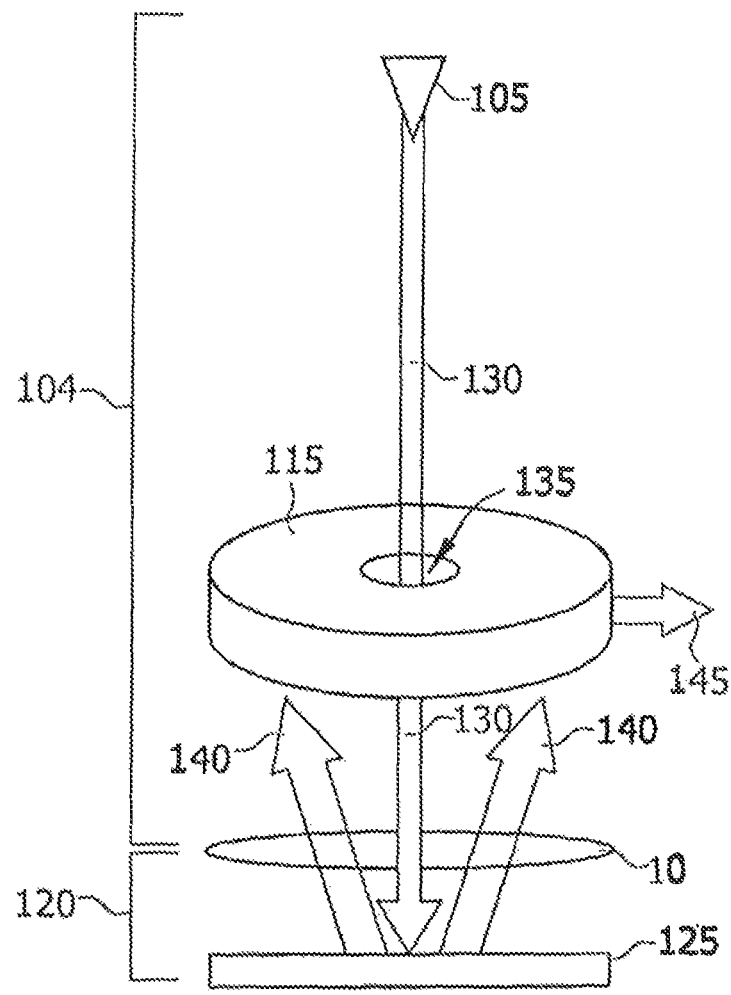
FIG. 1 shows schematically a detection scheme according to the state of the art.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. Embodiments of the present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

As describe herein, discussions and descriptions relating to the detection are exemplarily described with respect to electrons in scanning electron microscopes. However, other types of charged particles, e.g. positive ions, could be detected by the device in a variety of different instruments.

According to embodiments herein, which can be combined with other embodiments, a signal beam is referred to a beam of secondary particles or a secondary beam, i.e. secondary and/or backscattered particles. Typically, the signal beam or secondary beam is generated by the impingement of the primary beam on a specimen. A primary beam is generated by a charged particle beam source and is guided and deflected on a specimen to be inspected or imaged.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications Generally, when referring to focusing a charged particle beam, it is understood that the beam of charged particles is reduced in divergence. This means, the charged particles of a beam are focused or at least collimated towards a subsequent beam optical element to decrease losses of charged particles due to divergence or due to blocking of charged particles. Correspondingly, defocusing is understood as increasing the divergence.

For EBI applications, a bright field (BF) detector, as described above, is used, but it is not sensitive enough to changes in topography or surface potential (voltage contrast—VC). VC can be enhanced by energy filtering the SE signal, while topography information resulting from physical defects can be enhanced by using multiple sensors that collect only SE within certain ranges of take-off angles at the sample. According to typical embodiments, which can be combined with other embodiments described herein, topography detectors can be divided into 4 or more segments (with or without a central BF area) which can be read separately. The signals can then be combined (e.g. subtracted) to enhance contrast. For meaningful multi perspective imaging, including energy or angular filtering, the information carried by the SE needs to be conserved while the beam is transferred from the sample to the sensor. Thus, according to embodiments described herein, an optical system (SE optics) is provided. According to some embodiments, the SE optics can include a beam splitter that separates the primary beam and the SE bundle, one or more SE focus lenses, and alignment deflectors.

For defect inspection tools and review tools or critical dimensioning tools an enhanced contrast, for example topography, can be generated by detecting secondary particles depending on their starting angle. Thereby, enhanced contrast of the inspected features and/or defects can be obtained. For detection of the secondary particle beam depending on the starting angle, separation of the secondary beam to individual detection elements or detection is provided. However, particularly for high-speed detection applications, as referred to in embodiments described herein, manufacturing of a sensor with individual segments, which are closely packed without dead area between them, i.e. which do not have a significant gap between the sensor elements, is difficult.

Particularly for EBI applications, high throughput is desired, which results in the need for extremely fast sensors. Accordingly, PIN diodes can be used. However, the obtainable bandwidth depends on the size of the diode, and a sensor area 1 mm$^2$ or below is typically utilized. Accordingly, the dead areas in a detector arrangement are increased if the detection speed is increased.

Embodiments described herein provide a detector arrangement and a secondary beam optics, which allows for high-speed topography measurements. Some embodiments described herein provide a high speed detector that allows further to easily switch between BF imaging, wherein all SE reach a single detector, and topographic imaging, wherein at least 2 sensors, typically at least 4 sensors for the 4 quadrants of large starting angles are provided. Additionally, a central detector for low angle SE can be provided. According to some embodiments, which can be combined with other embodiments described herein, in both imaging modes the SE can also be filtered according to their energy, such that only SE with an energy above a certain threshold reach the sensor, i.e. the detector arrangement.

According to an embodiment, which can be combined with other embodiments described herein a secondary charged particle detection device for detection of a signal beam is provided. The device includes a detector arrangement having at least two detection elements with active detection areas, wherein the active detection areas are separated by a gap, a particle optics configured for separating the signal beam into a first portion of the signal beam and into at least one second portion of the signal beam, and configured for focusing the first portion of the signal beam and the at least one second portion of the signal beam. The particle optics includes an aperture plate and at least a first inner aperture opening in the aperture plate, and at least one second, radially outer aperture opening in the aperture plate, wherein the aperture plate is configured to be biased to one potential surrounding the first aperture opening and the at least one second aperture opening.

Figure 2A:
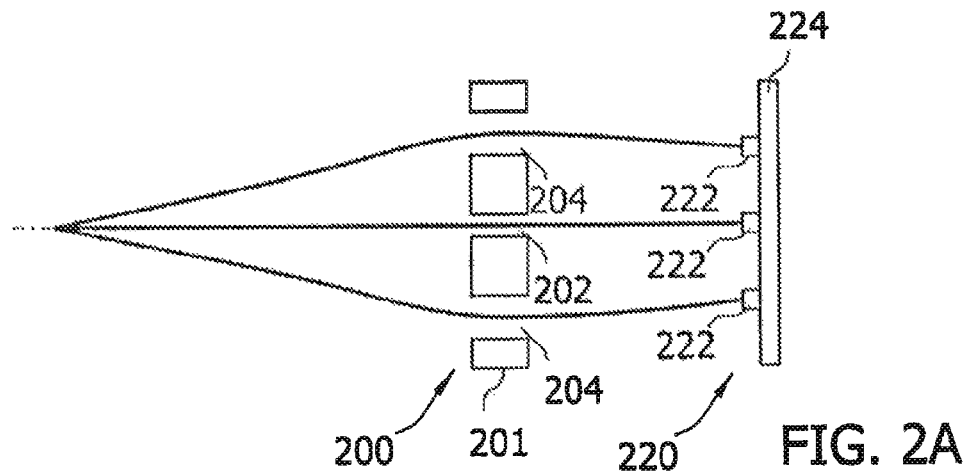
FIGS. 2A and 2B illustrate a secondary particle optics and a detection assembly according to embodiments described herein.
Figure 2B:
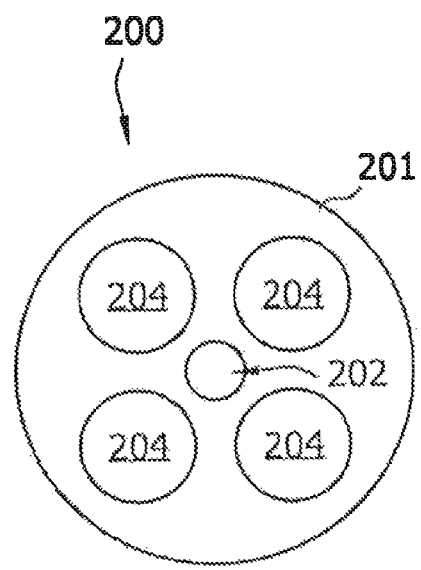
Figure 2C:
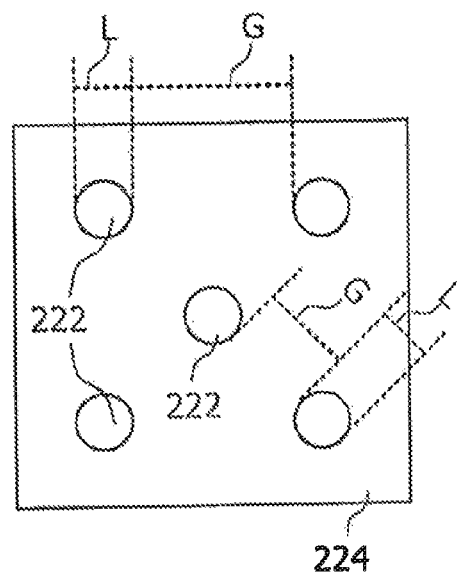
FIG. 2C illustrates a view of a detector arrangement according to embodiments described herein.

FIG. 2A shows a detector arrangement 220, with detection elements 222. As can be seen in FIGS. 2A and 2C, the detection elements 222 are separated from each other by a gap between the detection elements 222. The detection elements 222 are supported by a holder 224 of the detector arrangement 220.

According to typical embodiments, which can be combined with other embodiments described herein, the separation, i.e. the gap between the detection elements 222, has at least the same length in the corresponding dimension as the active area of the detection elements 222. According to typical embodiments, the gap can be in a range of 1 mm to 10 mm. A typical ratio G/L of the gap and the corresponding length of active area, which can be utilized alternatively or additionally to the above-mentioned gap dimension, can be 1 or above and 7 or below.

According to yet further embodiments, which can be combined with other embodiments described herein, the detection elements 222 can be PIN-diodes, which are used as the sensor for detecting secondary particles, for example secondary electrons. According to yet further embodiments, which can be combined with other embodiments described herein, the devices and methods for separation of the signal beam traveling along optical axis 2, can also be utilized for other detectors, e.g. detector assemblies including scintillators, avalanche photo diodes (APD), or the like.

As described herein, secondary particles or secondary electrons are understood as either backscattered particles/electrons or particles/electrons, which are generated due to impingement of the primary charged particle beam on the specimen.

PIN-Diodes can be used for high-speed detection applications in light of their large bandwidth, for example in the range of 1 to 10 GHz or 2 GHz or above. Thereby, the active area of the Pin-diodes limits the detection speed. That is, the larger the active area of the pin diode, the slower the detection speed. Accordingly, the active area of the pin diodes is reduced to an area of 1 mm$^2$ or below, in order to provide the desired detection speed of 2 GHz or above. The size of the active area of the detection element 222 delimits the ratio of the detection area as compared to the gaps there in-between. Accordingly, the detector arrangement 220 having a desired bandwidth for high-speed detection is provided with the gaps between the active areas of the detection elements. Accordingly, a spatial separation, which is dictated by the design of the detection elements 222, is given.

According to embodiments described herein, a secondary particle optics 200 is provided. As shown in FIGS. 2A and 2B, the particle optics 200 includes at least an aperture plate 201 having two or more aperture openings. The aperture plate 201 can be biased to a deceleration potential. Thereby, the deceleration of the aperture plate 201 in combination with an acceleration of the detection elements 222 are configured for a separation and focusing of the secondary particles, e.g. the secondary electron beam. In light of the two or more aperture openings, the separation of the secondary beam on different detection elements can be provided. According to typical embodiments, the aperture plate 201 has a central aperture opening 202 and at least two radially outer aperture openings 204. Typically, four outer aperture openings 204 can be provided.

According to typical embodiments, the secondary optics 200 includes the aperture plate 201 with a single central aperture opening or hole surrounded by a group of at least 4 outer aperture openings or outer holes. Thereby, the center can e.g. be being defined by the optical axis of the signal beam bundle. The plate can be arranged perpendicular to this optical axis. Detection elements 222 of detector assembly 220 are positioned behind the plate, e.g. in a plane parallel to the aperture.

According to typical operation conditions for a topography measurement mode, the signal beam, e.g. the SE bundle, is made slightly divergent and the plate is biased such that the SE are decelerated while they approach the plate. When the electrons are slow, they are easily deflected towards the aperture openings in the plate, which means that the SE bundle is split into a central portion (low angle SE) and a group of at least 4 outer bundles, corresponding to SE with large polar starting angles and grouped around at least 4 azimuthal directions. After passing through the aperture openings, the secondary particles are accelerated again to a significantly higher energy, e.g. a similar energy, which the secondary particles have before entering into the decelerating field of the aperture plate. According to typical embodiments, the secondary particles can have an energy of about 20 keV to 50 keV, e.g. 30 keV, before deceleration. They are decelerated to an energy of 100 eV to 15 keV, e.g. 5 keV, when passing through the aperture plate. Thereafter, they are accelerated to an energy of about 20 keV to 50 keV, e.g. 30 keV, towards the detection elements 222. This acceleration has a focusing effect which allows for concentrating the separated bundles on the small detection elements. The distribution of the secondary particles, e.g. the secondary electrons of the signal beam, behind the aperture plate is not just a projection of the holes in the aperture plate: the deceleration deflects the secondary particles to the holes that would otherwise just hit the plate and get lost; the accelerating field between the aperture plate and the detection elements concentrates the individual bundles of the signal beam, which would without the biasing of the aperture plate and the detection elements be too large for a small high speed sensor.

Figure 2D:
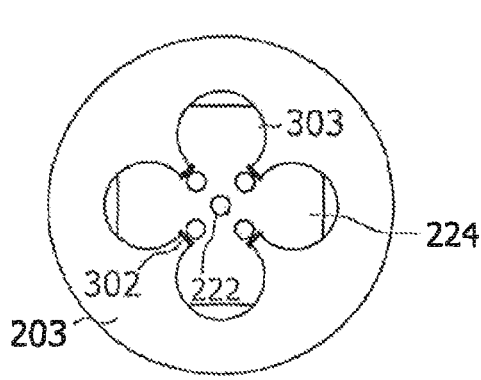
FIG. 2D illustrates a secondary particle optics and a detection assembly according to embodiments described herein.

According to yet further embodiments, an additional control electrode of similar design as the decelerating aperture plate can be used to fine control the trajectories. Thereby, according to some embodiments, an electrode similar to the electrode shown in FIG. 2B could be used. The additional control plate could operate as a focusing device. However, using the design shown in FIG. 2D, the plate 203 can be operated as a deflection device to align the individual bundles radially to the sensors by applying a positive or negative bias. Thereby, according to some embodiments, plate 203, which can be configured to be biased, and/or deflection elements 302, such as pole pieces or electrodes, can be provided. Deflections electrode can thereby move the beam radially. Recesses 303 can be provided to shape the field for adjusting the bundles to the detection elements. Both options, i.e. plate 201 and plate 203 are illustrated in FIG. 3B, wherein the additional control electrode is depicted with an inner portion being dotted to be similar to the aperture plate 201, whereas without the dotted part a cross-section similar to the design of FIG. 2D is obtained.

According to some embodiments, which can be combined with other embodiments described herein, a secondary particle optics 200 as shown in FIG. 2B can be provided. The central aperture opening 202 in the aperture plate 201 corresponds to the central detection element 222 of FIG. 2C. The outer aperture openings 204 correspond to the outer detection elements 222 in FIG. 2C. According to typical embodiments, the diameter or the corresponding dimension of the aperture openings can be 1 mm to 4 mm for the central aperture opening 202. For the outer aperture openings 204 the diameter or a corresponding dimension can be 3 mm to 10 mm.

Figure 2E:
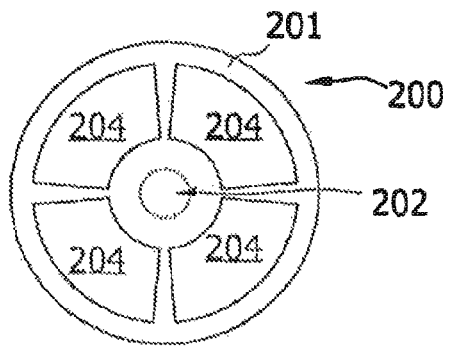
FIG. 2E illustrate a secondary particle optics according to embodiments described herein.

As shown in FIG. 2E, the aperture plate 201 of the particle optics 200 can also include aperture openings 204, which are not circular. Aperture openings having a tangential elongation or being shaped in the form of a portion of a ring or the like can decrease the dead areas of the aperture plate 201, i.e. the areas where signal particles, e.g. signal electrons, can not pass through the openings in the plate. As further illustrated in FIG. 2E by the dotted lines of inner opening 202, the inner opening can be optional. Accordingly, only outer openings might be provided according to some embodiments, which can be combined with other embodiments described herein. In such a case it is also possible to increase the radial length of the openings 204. An aperture plate with outer openings 204 only, can be used for topography measurements, either with or without additional energy selection.

According to different embodiments, the first opening and/or the at least one second opening in the aperture plate 201 can have a shape selected from the group consisting of: a round opening, a portion of a sector of the aperture plate, e.g. a sector of an annulus, or a similar shape. Thereby, round openings can be considered in light of their beneficial focusing properties of the signal beam bundles. Other shapes might result in smaller dead areas within the aperture plate and, thus, a better collection efficiency of signal particles.

As shown in FIG. 2C, the detector arrangement 220 has five detection elements 222, which correspond to the areas of the secondary beam optics 200 shown in FIG. 2B. According to typical embodiments, which can be combined with other embodiments described herein, five areas and corresponding detection elements 222 are provided. Thereby, a central area and a central detection element and four outer areas and four outer detection elements can be provided. Accordingly, the secondary particles released from specimen can be discriminated by the starting angle, i.e. whether the central detection element detects the secondary particle or an outer detection element detects the secondary particle. Further, separation of the direction of the starting angle can be provided for the larger starting angles, which correspond to an outer area. Thereby, depending on which of the outer detection elements or channels of the detector arrangement measures the secondary particles, the direction of the starting angle can be determined.

FIG. 2C further illustrates the size of the detection areas, which are indicated by reference L, as compared to the gap G between the active detection areas. Accordingly, the detector arrangement 220 has dead areas between the active areas of the detection elements. As described above, this is due to the size of the active area of the sensor corresponding inversely to the bandwidth of the detector arrangement.

Figure 3A:
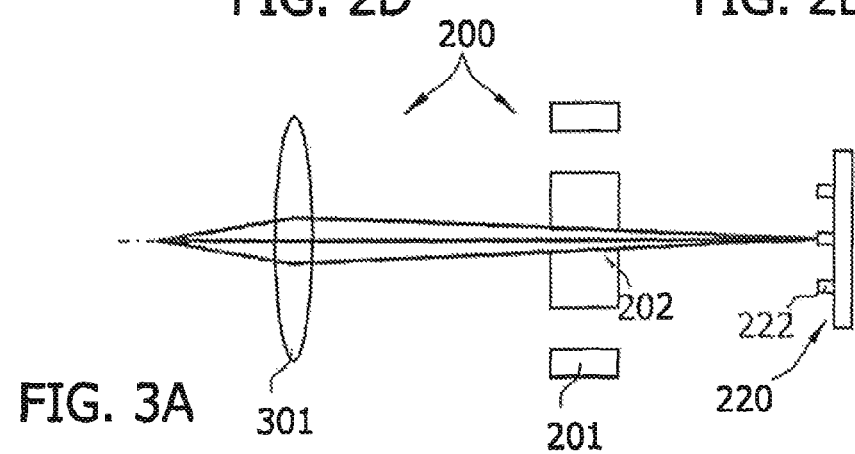
FIG. 3A illustrates a secondary particle optics and a detection assembly according to embodiments described herein.
Figure 3B:
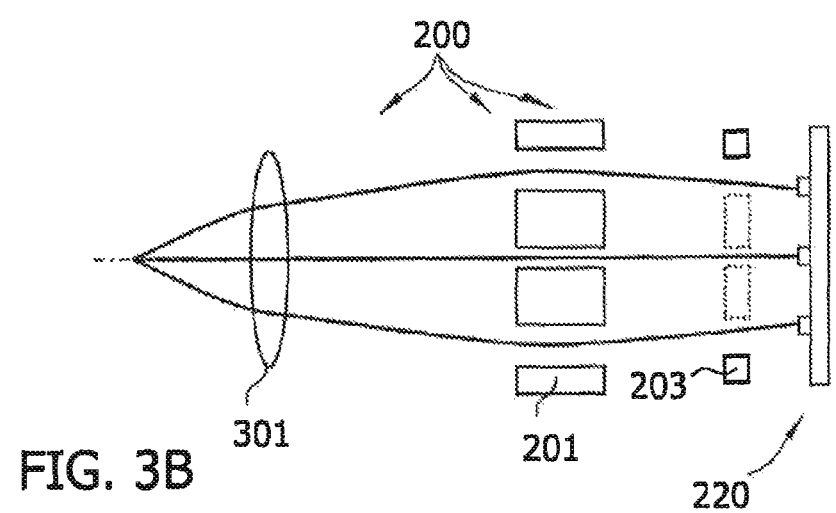
FIG. 3B illustrates a secondary particle optics and a yet further detection assembly according to embodiments described herein.

As shown in FIG. 3A, the secondary particle optics 200 can include the aperture plate 201 and additionally the focus lens 301 configured for focusing the secondary particles. Thereby, as illustrated in FIG. 3A, the generally divergent secondary particle beam can be focused to pass through the aperture plate 201 at the central aperture opening 202 and to be detected at the central detection element 222.

According to yet further embodiments, which can be combined with other embodiments described herein, as shown in FIG. 3B, the focus lens 301 can be switched off or can be operated such that the secondary particles are formed to a beam diameter adapted to the size of the aperture openings in the aperture plate 201. Thereby, the secondary particles pass through all of the aperture openings. In light of the above, topography contrast and central BF imaging can be realized simultaneously (multi perspective imaging).

According to embodiments described herein, the detection device can analyze the angular and energetic information contained in a bundle of secondary particles, e.g. SEs. Thereby, the energetic information can be provided by biasing the aperture plate to a potential such that only particles with a sufficiently high energy can pass through the aperture openings of the aperture plate. The focus lens 301 allows for adjusting the opening angle of the signal beam. The beam can be made divergent or convergent as required. Thereby, collection efficiency of secondary particles can be improved. Further, switching between a topography imaging mode and an energy filtered imaging mode can be provided.

Accordingly, embodiments described herein can relate to operation of the focusing lens, wherein the divergence of the secondary particle beam is changed due to the focusing lens. For one operational mode the divergence of the beam can be adapted such that the beam has a beam diameter at the aperture plate resulting in essentially a maximum of secondary particles passing through at least one of the aperture openings, i.e. the inner or one of the outer aperture openings. In this operation mode, the signal particles, e.g. the signal electrons, can be detected dependent from their starting angle. In another operational mode the divergence of the particle beam is changed due to the focusing lens such that essentially all secondary particles, e.g. secondary electrons pass through the inner aperture opening. Thereby, all signal particles are detected with one detections element 222.

Figure 4:
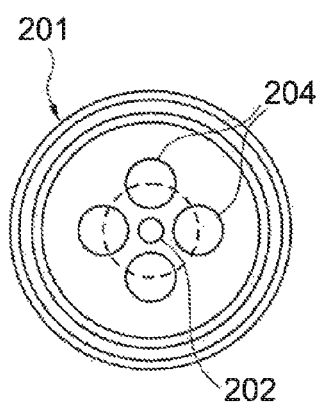
FIG. 4 illustrates a secondary particle optics having an aperture plate.
Figure 5:
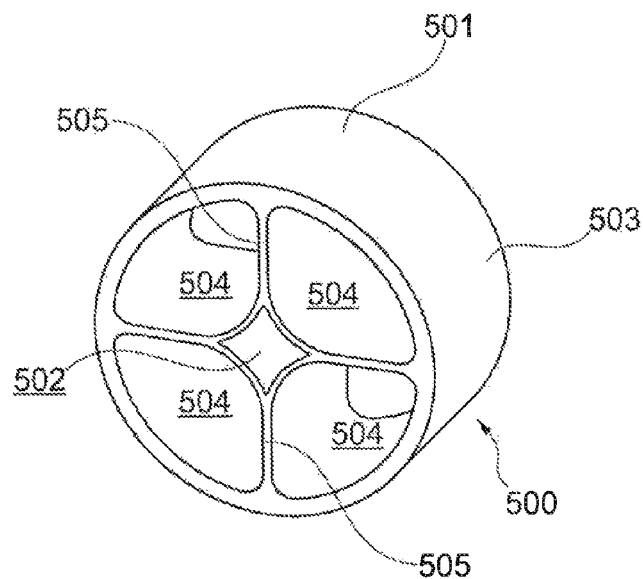
FIG. 5 illustrates a secondary particle optics having an aperture plate according to embodiments described herein, wherein the central opening has concave portions, i.e. pincushion shape.
Figure 6A:
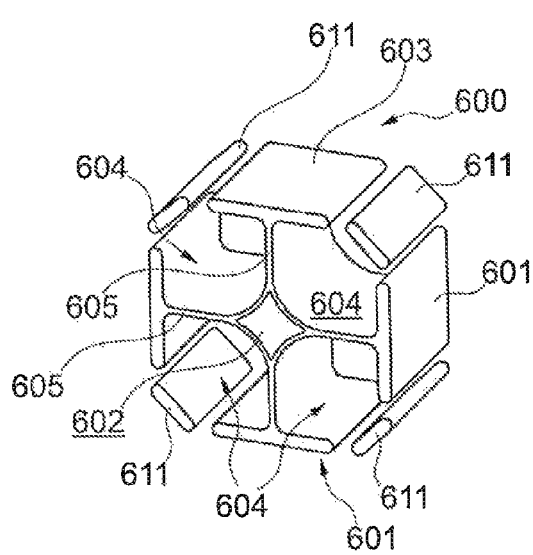
FIGS. 6A and 6B illustrate further embodiments relating to an aperture plate and biasing thereof.
Figure 6B:
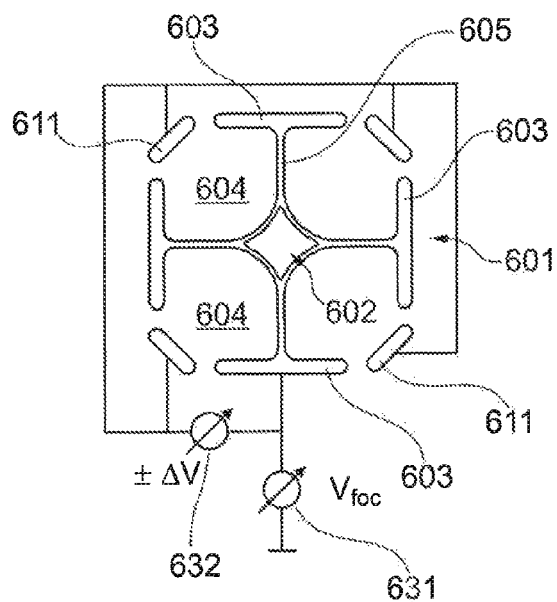

According to embodiments described herein, the particle optics and particularly the aperture plate 201 is provided as shown in FIGS. 5, 6A and 6B. Thereby, the performance of basic aperture plates, as e.g. shown in FIG. 4, can be improved with regard to various aspects. As shown in FIG. 4, the aperture plate 201 with 5 holes (202 and 204, respectively) has a cross section with blocking or solid areas, which are rather large. The dashed circle indicates the cross section of the impinging SE bundle.

As shown in FIG. 5, and according to some embodiments, which can be combined with other embodiments described herein, the aperture plate 501, which is a part of the particle optics 500 configured for signal particles, has and outer region 503, e.g. a circular body. The area between the holes 504 is provided by division bars 505. Accordingly, the area between the holes is reduced to be more narrow. A central hole 502 is provided, e.g. with a pincushion shape. According to embodiments described herein, the hole having the pincushion shape is alternatively described as having concave portions, i.e. portions that are bended inwardly towards the center of the opening. Thereby, the potential distribution in the outer holes can be smoothened, which leads to better focusing properties, particular of the outer holes. According to some embodiments described herein, the outer holes 503 are defined at least at two sides by a bar, e.g. a division bar 505. Accordingly, the outer holes have a straight boundary at a length of at least 30% of their perimeter. According to yet further embodiments described herein, which can be combined with other embodiments described herein, the central hole 502 has at least two, typically at least four concave regions in the perimeter, e.g. has a pincushion shape.

In light of the above, it is possible to provide a reduction of the loss of signal electrons at the aperture plate from typically about 30% to less than 5%. This is inter alia achieved by reducing the head-on cross-section of the device. That is, embodiments described herein, have a reduced area with solid material in the cross-section.

In spite of the abandonment of a circular design of openings, a good focusing of the beamlets can be achieved by shaping the geometry such that the electrostatic potential of the sub-lenses is nearly rotationally symmetric and/or by applying a strong decelerating field in front of the device and a strong accelerating field after the beam separator. Good focusing increases the operating window when large diameter pin diodes are used and/or allows for the use of smaller pin diodes, thus enabling increased detector bandwidth.

According to yet further embodiments, which can be combined with other embodiments described herein, and as shown in the figures herein, the aperture plates 201, 501 and 601 have a thickness of at least 5 mm. The thickness is provided by an extension in axial direction or in direction of the optical axis of the signal particles. Typically, the thickness or extension in axial direction or in direction of the optical axis of the signal particles is from 10 mm to 20 mm. Thereby, an increased separation of the beamlets can be provided. Typically, a separation of 10 mm between the central beamlet and the outer beamlets can be achieved. This allows for the utilization of standard pin diodes with 5 mm diameter and enables a feasible design of the sensor element. Yet further in light of the fact that the reach-through of the accelerating field between aperture and sensor is influenced by the thickness of the plate, a reduction of operating voltage is a beneficial side effect coming from the elongation of the device, i.e. a minimum thickness or minimum extension in axial direction or in direction of the optical axis of the signal particles. This helps to achieve better high voltage immunity, reliability and stability and enables a feasible design of the device.

According the present disclosure, the aperture plates 201, 501, and 601 are described as a plate with a minimum thickness. Alternatively, the aperture plates could also be described as tubes and these terms can be used exchangeably. However, as the radial dimension is typically larger than the axial dimension mostly it is referred to as aperture plates. Yet, references to tubes or tubular structures herein, take into consideration the minimum thickness of the plate according to some embodiments.

As shown in FIGS. 6A and 6B a further additional or alternative modification can be provided by an adjustable separation of the beamlets. This provides a fine adjustment which allows to always center the beamlets to the sensors. According to embodiments described herein, an adjustable separation can be provided by splitting the outer region (see, e.g. 503 in FIG. 5) or the outer tube of the beam separator, i.e. the aperture plate. Accordingly, some embodiments include a division bar 605 for separating the openings 604, first outer portions 601 and second outer portions 611. For example, the first outer portions 601 can have a T-shaped cross-section in combination with the division bars 605. Thereby, a central cross-shaped section including at least four T-shaped structures is provided. The central hole 602 is provided essentially in the center of the cross-shaped section. Four T-shaped structures surround the central opening 602, wherein each T-shaped structure is provided by a division bar 605 and a first outer portion 601.

The central cross shaped portion is biased to $V_{foc}$. This is illustrated in FIG. 6A, wherein power supply 631 is connected to the central cross shaped portion. The four second outer portions 611, e.g. the four additional deflection plates (one per outer beamlet), can be biased to $\pm\Delta V$ with respect to the central part of the device, i.e. there is a non-zero voltage, which is positively or negatively added to the potential of the central part. A second power supply 632 is provided to provide a voltage to the second outer portions or an offset voltage with respect to the voltage of the first power supply to the second outer portions 611. Accordingly it is optionally possible to create an inward or outward deflection of the outer beamlets.

Even though the central portion is described as cross-shaped, which corresponds to the four openings 604 shown in FIGS. 6A and 6B, three openings, five openings, six openings or an even higher number of openings results in a corresponding shape of the central portion and is to be considered a yet further modification of the embodiments described with respect to FIGS. 6A and 6B.

The embodiments described with respect to FIGS. 6A and 6B add another degree of freedom to the biasing of the aperture plate 601. Although focusing and beam separation are generally linked to each other, the design of the device allows to change the mutual separation of the beamlets without unacceptable deterioration of the focus. This can be used to compensate variations in SE energy or angular distribution caused by variations in column operation, e.g. different landing energies of the primary beam, changes in extraction field, local topography and the like.

According to some embodiments, as described above, the thickness of the plate can be adjusted to determine the reach-through of the accelerating field between aperture and sensor. According to yet further additional or alternative embodiments, the above-described additional features on the aperture plate, e.g. on the side facing the decelerating field, can be arranged in order to influence the spatial distribution of the decelerating field. According to yet further additional or alternative embodiments, the ratio of the aperture diameters of the inner aperture opening, e.g. central aperture opening, and the outer aperture opening can be varied. According to typical examples, the diameter of the outer aperture openings can be at least 2 times the diameter of the inner aperture opening. However, this value might be dependent of the number of outer aperture openings. That is, the higher the number of outer aperture openings, the smaller above-described diameter ratio. For example, if the aperture plate would contain a large number of identical holes in a regular pattern, e.g. a hexagonal pattern, the ratio would drop to 1. According to typical embodiments, the aperture openings can be round or can have any other desired shape such as a shape of a portion of an annulus, a ring or the like.

According to some embodiments, which can be combined with other embodiments, four outer aperture openings can be provided. Thereby, the detection device is sensitive to topography in two orthogonal directions. This also relates to the fact that wafer structures have two distinct perpendicular directions. According to typical operation methods, the detector can be rotated to a first angle to get maximum sensitivity for the desired topography of the object to be imaged, e.g., the wafer structures. Further, the detector can be rotated by 45 degrees as compared to the first angle in order to suppress the signal from the regular structures and enhance the defect contrast. Thereby, according to yet further implementations thereof eight outer aperture openings can be utilized. By choosing the rotation angle of the detector as described above, every second aperture opening (e.g. openings #1, 3, 5 & 7) and corresponding detection elements of eight outer detection elements can detect regular structures of an object to be imaged, while the interjacent aperture openings (e.g. openings #2, 4, 6 & 8) and corresponding detection elements would be sensitive to defects. The above variations can be independently or in combination be utilized to obtain a high detection efficiency, i.e. low loss of secondary particles on the splitting aperture and low loss of secondary particles on the detector, as well as good discrimination of the secondary particles depending on the starting angle.

According to some embodiments, the detection device can be switched between a topography measurement mode and a one-detection-channel mode. A 100% BF image can be produced. Thereby, the deceleration can be switched off by biasing the aperture plate to the potential of the signal beam. Further, the focus lens 301 is controlled to focus the beam so that it can completely pass the central aperture 202 for detection on the corresponding central detection element 222. According to a yet further operational mode, the signal beam can be focused towards the center of the central aperture opening and a decelerating voltage can be applied to the aperture plate. Thereby, an energy filter can be provided, wherein only signal particles with a sufficiently high energy can pass through the aperture opening. Signal particles for which the deceleration gets too strong are reflected at the aperture plate. Accordingly, an energy filter can be provided. Similarly, the topography operational mode utilizing also the outer aperture openings, which is described above, can be combined with energy filtering by raising the decelerating voltage of the aperture plate until the signal particles with lowest starting energy are reflected. Accordingly, only signal particles with larger starting energy can pass through one of the openings in the aperture plate to be accelerated towards a corresponding detection element and be detected for signal generation.

As described above, the particle optics 200 according to embodiments described herein, splits the signal beam, e.g. the SE bundle, into a plurality of smaller bundles. For example, this can be a central, inner bundle (SE with low starting angle) and a number 1, 2, 4, 8 or even more, outer bundles with high polar starting angles. Thereby, each partial bundle can be centered around an average azimuthal angle. According to typical implementations, the number of outer bundles can at least be 4 to obtain topographic sensitivity in 2 dimensions. However, higher numbers are also possible.

According to embodiments, described herein, the bundles, i.e. the portions of the signal beam, are detected using individual detection elements of a detector assembly. The detection elements are spatially separated by a gap G as illustrated in FIG. 2C. For example, the detection elements can be the electron detectors (pin diodes, scintillators etc). Accordingly, closely arranged detection elements, e.g. segmented pin diodes or the like can be avoided. Thereby, problems related to the pin diode area that separates the active segments, such as charging, signal loss, and/or cross-talk can be avoided. The high price and complicated development cycles of segmented detectors can be avoided. Yet further, there is an increased flexibility in sensor design, which can also result faster time-to-market cycle.

According to embodiments described herein, the secondary beam optics 200 is utilized for charged particle beam devices, wherein a secondary beam or signal beam is separated from the primary beam, i.e. the primary beam being guided on the specimen for impingement of the primary beam thereon and the resulting generation of the signal beam or secondary beam.

There are two principle methods for separating the primary and secondary electron beams, both of which take advantage of the fact that the force on a moving electron traversing a magnetic field is dependent upon the electron's velocity. This is a fundamental principle described by the Lorentz force law. Since the primary electrons and secondary electrons are essentially traveling in opposite directions, the force acting upon the two bundles will be opposite in direction when traveling through a transverse magnetic field.

Figure 7A:
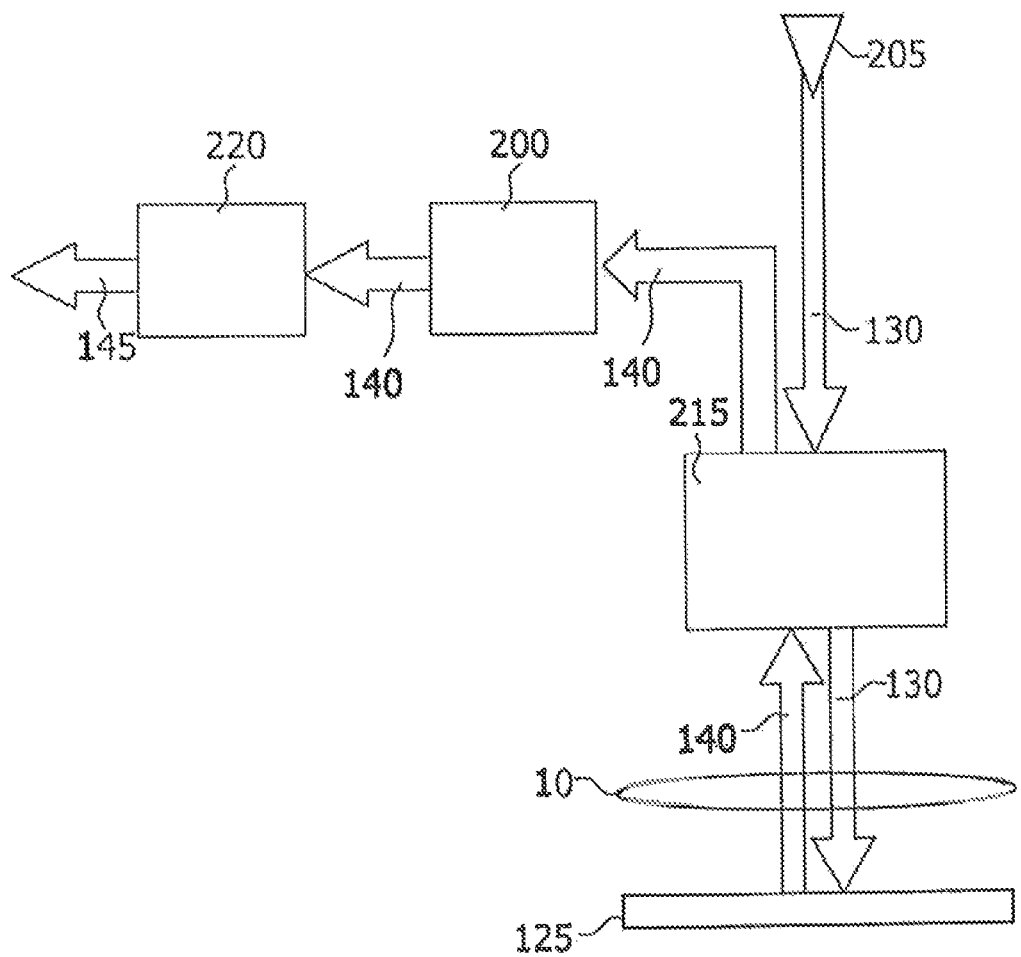
FIG. 7A shows a schematic view of a system, which can be utilized for a secondary particle optics and a detection assembly according to embodiments described herein and having a Wien filter type separating unit.

One possible beam separator is the Wien filter. A Wien filter arrangement in accordance with an embodiment of the invention is shown schematically in FIG. 7A. An emitter 205 emits a primary-electron beam 130 which passes through Wien-type momentum-dispersive filter 215 and is focused by objective lens 10 on a sample 125. Secondary-electron beam 140 passes through objective lens 10 and Wien-type filter 215 in a direction opposite to that of primary-electron beam 130. The Wien filter can be adapted such that the primary-electron beam 130 passes unaffected by Wien filter 215, while secondary-electron beam 140 is bent as it passes through Wien filter 215 so that it exits the column inclined with respect to primary-electron beam 130. Once separated from the primary-electron beam, the secondary electrons can be focused and filtered, e.g., by secondary-electron optics 200, a charged particle unit for deflecting and focusing charged particles, without any effect on the primary-electron beam. Electron detector 220 detects the secondary electrons and produces a secondary-electron signal 145 for each of the detection elements 220, i.e. for each of the detection channels. Though the primary beam and the secondary beam actually occupy the same physical space above the specimen plane, they are drawn as separate arrows in FIG. 7A for convenience of illustration.

The Wien filter uses crossed electric and magnetic fields, the amplitudes of which are adjusted so that there is zero net force on the primary beam and a deflection (transverse) force on the secondary beam.

Figure 7B:
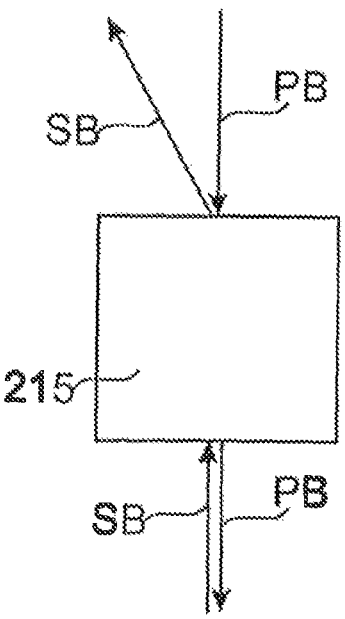
FIGS. 7B to 7D show schematically other beam paths that may be realized with a Wien filter type separating unit.
Figure 7C:
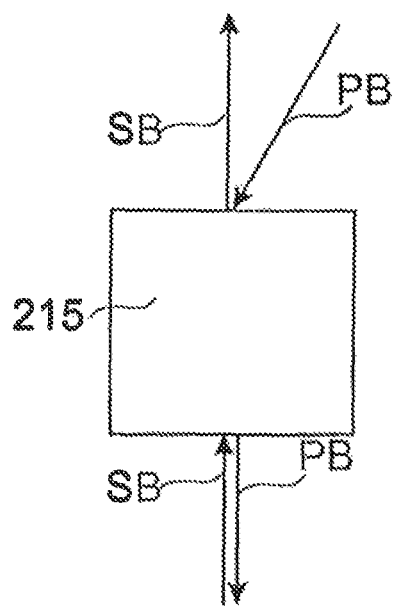
Figure 7D:
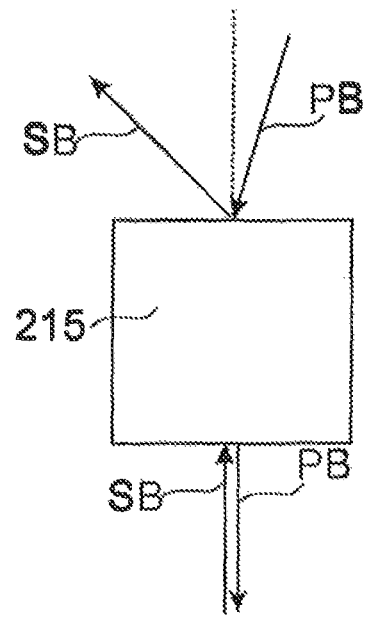

Schematic views of the usage of a Wien filter 215 are further shown in FIGS. 7B and 7C. Thereby, the electric and magnetic fields within the Wien filter are adjusted such that in FIG. 7B the primary charged particle beam is unaffected. Contrary thereto, within FIG. 7C the electric and magnetic fields are adjusted such that the secondary charged particle beam is unaffected. Nevertheless, both embodiments utilize the separation of the primary and secondary beam. Thus, focusing or filtering can be applied to the beam of secondary charged particles without influencing the primary charged particle beam. According to a further option as shown in FIG. 7D it is further possible that both beams are deflected to some degree, whereby a beam separation is achieved. For example, according to some embodiments, which can be combined with other embodiments described herein, an achromatic ½ ExB Wien filter can be provided. Thereby, the primary beam can be achromatically deflected and the primary beam and the secondary beam are separated.

Figure 8A:
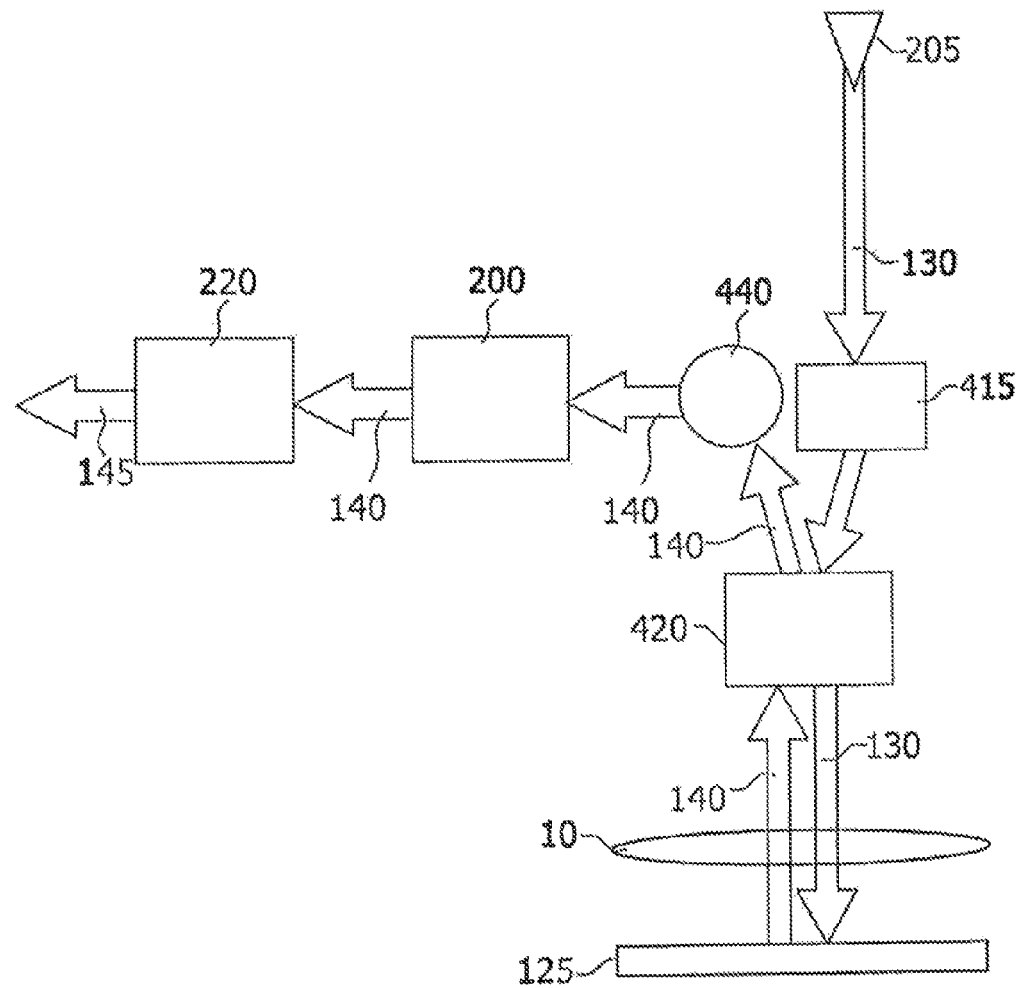
FIG. 8A shows a schematic view of embodiments, which can be utilized for a secondary particle optics and a detection assembly according to embodiments described herein, and having a magnetic dipole beam separating unit.

Another method of separating the primary and secondary beams is to use magnetic deflection without an electric field. FIG. 8A shows schematically an arrangement of magnetic-beam separator optics in accordance with an embodiment of the invention. Emitter 205 produces a primary-electron beam 130 which is first deflected by the first magnetic deflector 415 such that primary-electron beam 130 enters a second magnetic deflector 420 at an angle. To keep the effect of the magnetic beam separator on the primary beam small, the angle of deflection in the first magnetic deflector 415 should be kept below 10 degrees. Primary-electron beam passes through the second magnetic deflector 420 and is directed at specimen 125. Secondary electrons of beam 140 are then deflected by the second magnetic deflector 420 such that the total angle α of separation of primary beam 130 and secondary beam 140 is roughly twice that of the deflection of the primary beam in the first magnetic deflector 415 (15-20 degrees). This separation is enough to allow for a beam bender, sector 440, to be mechanically isolated from primary beam 130 and to be made strong enough to deflect secondary beam 140 so that the secondary electrons are now traveling with a large angle, that is between 30° and 100°, with respect to the primary beam.

Generally, sectors that might be combined with the embodiments disclosed herein might be electrostatic, magnetic or combined electrostatic-magnetic. Since the space required for an electrostatic sector is smaller than the space for a sector including a magnetic part, typically an electrostatic sector is used.

Following sector 440, which already has conducted a reduction of divergence (focusing) at least in one dimension, is a set of secondary-electron optics 200 which additionally focuses and deflects the secondary beam depending on the starting angle of the secondary electrons. Noteworthy is that this configuration may result in a shifted column; that is, the upper portion of the primary beam optics (e.g., emitter 205 and part 1 magnetic deflector 415) is shifted laterally from the lower portion (e.g., part 2 magnetic deflector 420 and objective lens 10). Thus, emitter 205 does not have line-of-sight view of specimen 125. After passing through secondary-electron optics 200, secondary-electron beam 140 is detected by electron detector assembly 220 to produce a secondary-electron signal 145 for each of the detection elements or each of the detector channels respectively.

To achieve large angle beam separation a beam bender or sector after the beam separator can be used. The primary beam is completely shielded and therefore unaffected by the sector fields. Sector 440 can be either electrostatic, magnetic or both. An electrostatic beam bender is used where space is a consideration.

Figure 8B:
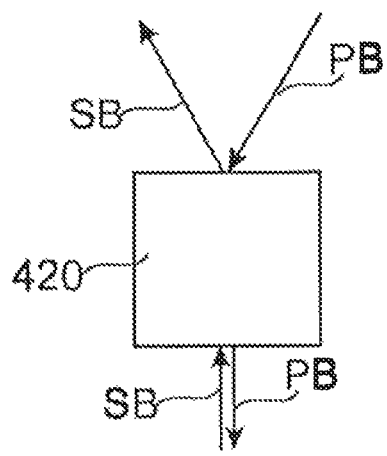
FIGS. 8B to 8D show schematically other beam paths that may be realized with a magnetic dipole beam separating unit.
Figure 8C:
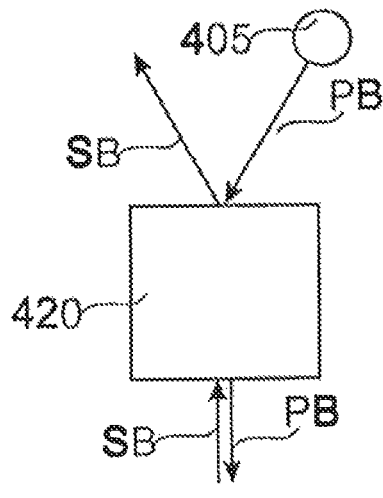

FIG. 8A refers to the specific embodiment realized with a magnetic deflector affecting the primary and the secondary charged particle beam. FIGS. 8B to 8C show schematically applications which can be realized in general. These beam paths may be combined with any other details of other embodiments.

Therein, a magnetic deflector 420 is shown. Within FIG. 8B the primary charged particle beam enters the magnetic deflector under a defined angle of incidence; and is deflected towards a specimen. The beam of secondary electrons, which are released from the specimen, enters the magnetic deflector on its way back towards the optical column and is deflected such that the primary charged particle beam and the secondary charged particle beam are separated. The magnetic deflector 420 acts as a separating unit between the primary and the secondary charged particle beam.

Figure 8D:
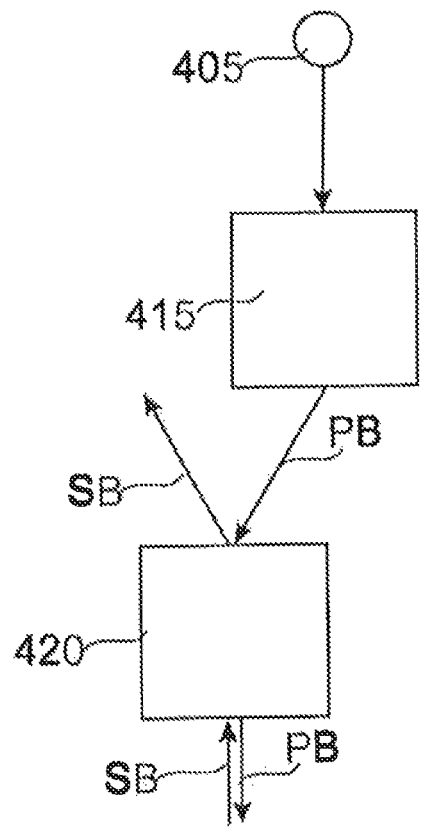

The general usage shown in FIG. 8B can be applied for different embodiments that are shown in FIGS. 8C and 8D. In FIG. 8C, the gun 405 emitting the electrons is tilted with respect to the electron direction on impingement on a specimen. If a parallel primary electron beam direction of emitted electrons and of electrons impinging on a specimen is required, a further magnetic deflector 415 may be used to compensate for the beam-tilt introduced by magnetic deflector 420. Again, these schematic beam paths can be combined with any other embodiments showing further details of the charged particle optics.

Figure 9A:
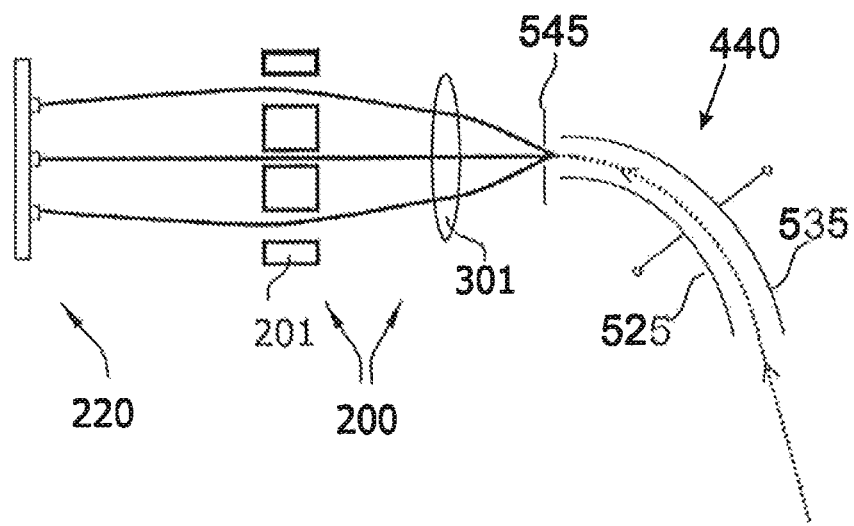
FIGS. 9A and 9B show schematic side views of charged particle units according to embodiments described herein.

Further embodiments will be described with respect to FIGS. 9A and 9B. FIG. 9A shows a sector 440. Sector 440 has a negatively-charged U-bend 535 and a positively-charged U-bend 525 serving to bend the electron beam. Optionally, a pair of sector side plates can be provided. Thereby, the electron beam is focused in one dimension and, additionally, is kept at a high energy to avoid time of flight effects which may have impact on high-speed detection. A focusing in the second dimension takes place in quadrupole element 545. Thereby, the sector 440 and the quadrupole form a double-focusing sector unit. Further, it may be possible to use a cylinder lens instead of a quadrupole to obtain double focusing.

The electron beam enters secondary beam optics 200 as described herein. Thereafter a detection at high speed and including a topography information correlated to the starting angle can be detected by detector assembly 220.

Figure 9B:
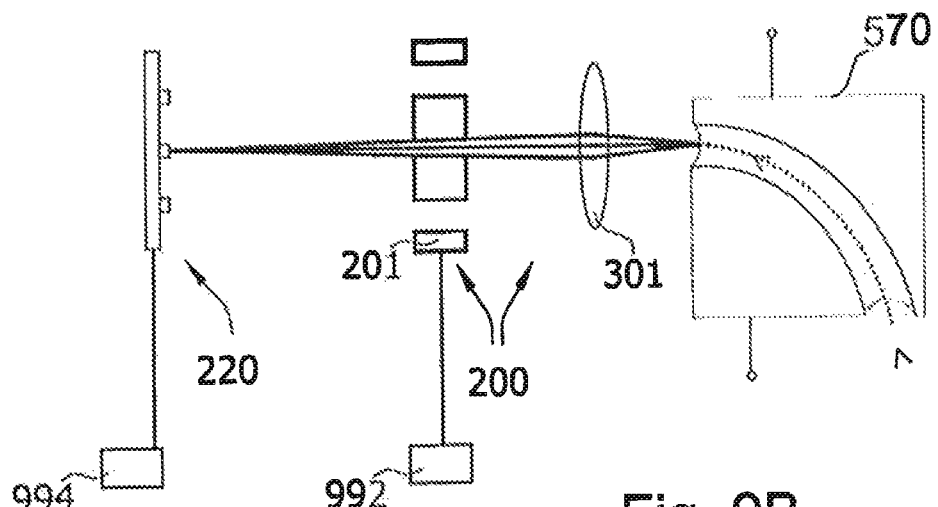

In the further embodiment of FIG. 9B a hemispherical sector 570 is used. In view of the hemispheric shape the electron beam entering the sector is focused in both dimensions. Thus, no additional focusing unit is required for the double-focusing sector unit 570. The secondary particles result in signal generations as described above.

According to yet further embodiments, which can be combined with other embodiments described herein, FIG. 9B further illustrates voltage supplies 992, 994, and 996. Voltage supply 992 is connected to aperture plate 201 for biasing thereof. Thereby, a deceleration field as described above can be provided. According to typical examples, the deceleration field can correspond to a decrease of particle energy of about 20 keV to 30 keV. Voltage supply 994 is connected to detection elements 222 in order to accelerate the secondary particles towards the detection elements 222. Thereby, also a focusing is provided. The acceleration field can correspond can correspond to an increase of particle energy of about 20 keV to 30 keV.

According to a further embodiment (not shown) the focusing of the double focusing sector unit (440, 545 in FIG. 9A or 570 in FIG. 9B) can be assisted with an additional focusing unit. Thus, the double focusing sector unit may also include additional lenses, for example an Einzel-lens. This additional lens may also be applied to move the focus of the sector to a position corresponding to the position of the filter, e.g. the potential saddle formed in the central opening of the aperture plate.

Figure 9C:
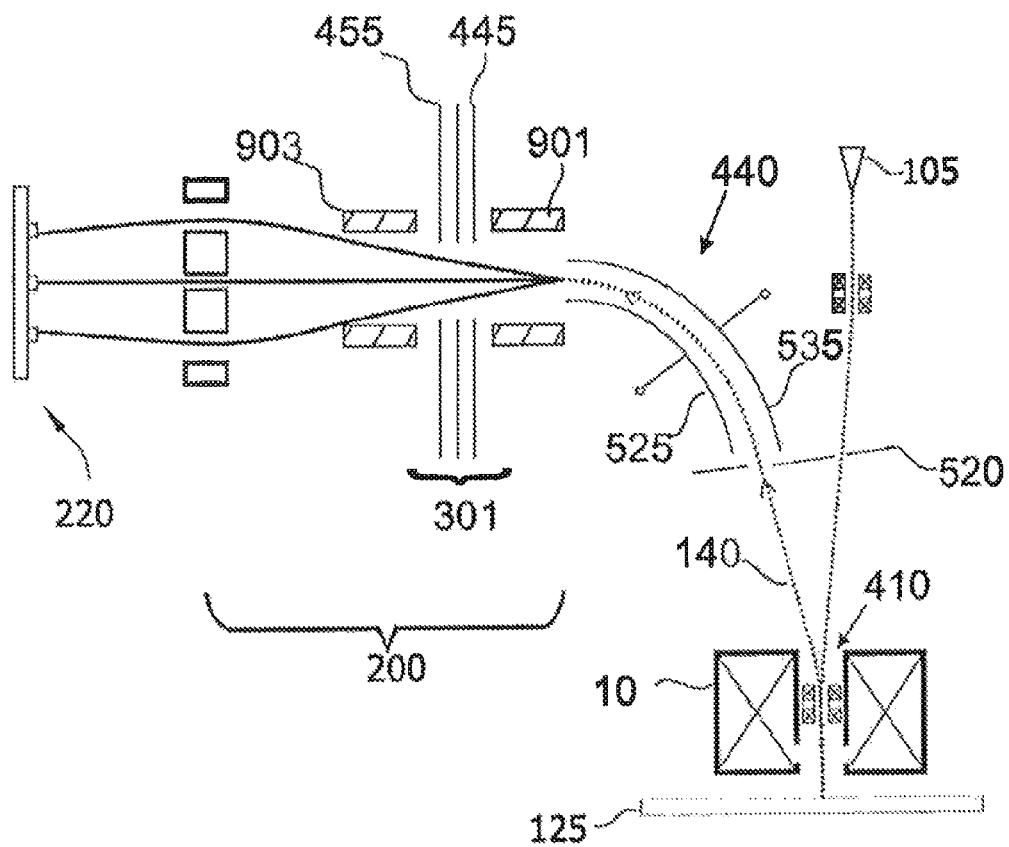
FIG. 9C shows a schematic side view of a charged particle beam device having a secondary particle optics and a detection assembly according to embodiments described herein.

A further aspect will now be described with respect to FIG. 9C, wherein the detection optics according to one embodiment is shown. FIG. 9C includes a sector 440 acting as a deflection angle increasing unit. The beam of secondary electrons, which has already been separated from the optical axis by an angle of for example 3° to 15°, is further deflected towards detector assembly 220.

Generally, an electrostatic beam bender can be either cylindrical or hemispherical. The cylindrical type suffers from the fact that as the beam is bent the secondary electrons are focused in one plane and not in the other. A hemispherical beam bender focuses the secondary beam in both planes. The cylindrical sector can be used with side plates biased to achieve focusing in the transverse plane, yielding similar focusing properties than the hemispherical sector.

FIG. 9C is a schematic view of such a cylindrical sector. Side plates (not shown) can be positioned—with respect to the perspective of this figure—in front of and behind the gap between the sector electrodes 525 and 535. According to typical embodiments, a first cross-over of the signal beam is provided essentially within the objective lens 10 or shortly thereafter. A second cross-over of the signal beam is typically provided after the sector 440. A third cross-over can be provided, depending on the operation mode (see, e.g. FIG. 3A) by the focusing action of the focusing lens 301.

According to yet further embodiments, which can be combined with other embodiments described herein, the particle optics 200 can include further elements as illustrated in FIG. 9C. Particularly for EBI applications and other applications with a larger field of view where the scanning of the primary electron beam influences the detection, e.g. scanning areas of 50 µm×50 µm and above, further optical elements can be utilized for the secondary optics 200. Thereby, the particle optics can shape the signal beam, e.g. the SE bundle, before the signal beam enters the beam splitting aperture plate 201. According to typical embodiments, which can be combined with other embodiments described herein, the particle optics can include the focus lens 301 and/or one or more deflection assemblies 901/903.

According to some embodiments, a focus lens can be provided. The focus lens focuses the signal beam on the central detection element to generate a bright field image. Alternatively, the focus lens focuses the signal beam onto a potential saddle in the central aperture, while the aperture plate is biased by a bias voltage to generate an energy filtered image. According to yet another alternative, the focus lens 301 can make the signal beam divergent or can adjust the divergence thereof such that the diameter of the signal beam is adjusted to the diameter of the decelerating aperture plate. Accordingly, the focus lens can be used to switch between different operation modes, i.e. imaging modes.

According to yet further embodiments, which can be combined with other embodiments described herein, the particle optics 200 can further include one or more deflection assemblies. Thereby, the deflection assemblies 901 and 903 can be controlled for aligning the signal beam, e.g. the SE bundle to the aperture plate. Additionally or alternatively, the deflections assemblies can be controlled for de-scanning the signal beam. That is a deflection (de-scan, anti-scan or counter-scan) is provided for compensating a movement of the signal beam which results from scanning of the primary beam, which generates the signal beam on impingement on a specimen.

According to typical embodiments, Anti-scan can particularly be applied in systems with a large field of view (FOV). For large FOV, e.g. of 100 µm×100 µm and above, the scan of the primary beam also deflects the signal beam. Without compensation thereof, this deflection of the signal beam results in a movement of the signal beam on the detector, which means that the detection result will not be uniform but will depend on the beam position in the FOV. Such a movement will particularly be noticeable, when the entire particle optics, which influences the signal beam (e.g., including the objective lens, a beam splitter, a beam bender and a focus lens) magnifies the image scan movement onto the detection element.

According to typical embodiments, for each of the deflection assemblies 901 and 903, a set of at least 4 deflection plates can be provide that can be connected to deflection voltages. The deflection voltages can be synchronized with the image scan of the primary beam and amplified and/or rotated such that deflection of the signal beam generated by primary beam scanning cancels the motion of the signal beam in the sensor plane.

According to some embodiments, a deflection assembly, e.g. a de-scan deflector, can be arranged immediately in front of the suggested detector assembly to keep the optical axis of the SE bundle fixed on the center of the central opening, independent of the PE beam position on the wafer. According to typical examples, a de-scanning can, however, also be provided as early as possible after secondary particle generation. This establishes a constant axis for the signal beam, which can thus be more easily aligned to the focus elements of the signal beam. Accordingly, aberrations for the signal beam due to focusing of the signal beam while the signal beam is travelling off-axis of a focusing elements can be avoided.

As shown in FIG. 9C, the first deflection assembly 901 can de-scan the signal beam and align the signal beam to the focus lens 301. The deflection of the first deflection assembly 901 can introduce a beam tilt with respect to the optical axis of the signal beam. This beam tilt can be compensated for by the second deflection assembly 903. The second deflection assembly can further improve alignment on the aperture plate 201.

A secondary electron beam 140 passes through an opening 410 in an objective lens 10 and an opening in a plate 520 to enter a sector 440. Sector 440 has a negatively-charged U-bend 535 and a positively-charged U-bend 525 serving to bend the secondary-electron beam 405. Further, a pair of sector side plates are provided. Secondary electron beam 405 is then aligned as it passes through an SE alignment quadrupole element 445 and focused as it passes through an SE focusing lens 450. Secondary electron beam 405 then passes through openings in grounded plate 455 and in SE optics 200 to an electron detector assembly 220.

A drawback of the cylindrical sector without side plates is that it focuses the SE beam in one plane (up and down on the page) and not the other (in and out of the page). This lack of focusing can be compensated by placing electrodes on the sides of the cylindrical sector to force focusing action in this plane. There are two motivations for uniform focusing action by the sector. One is to provide for a small spot on the high-speed detector and the other is to enable good energy filtering because the filter is sensitive to both energy and direction of the secondary beam.

Thus, the filter should be located approximately in a focus of the secondary electrons.

Figure 10:
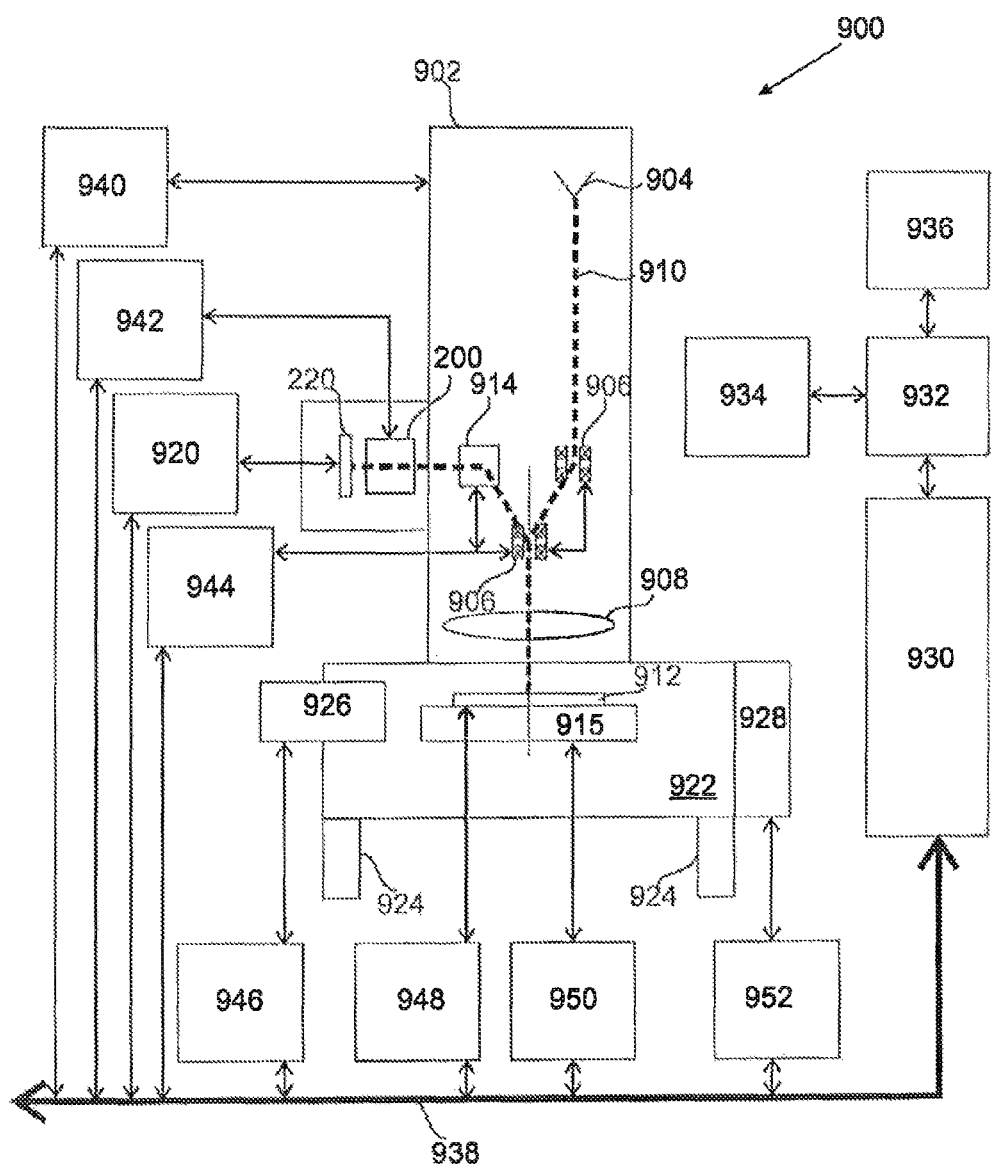
FIG. 10 shows a schematic side view of a charged particle beam device according embodiments described herein.

FIG. 10 is a schematic illustration of a wafer inspection system 900 in accordance with an embodiment of the invention, employing an electron-optical subsystem as described above with reference to FIGS. 2-6. An electron beam column 902 includes an e-beam source 904, magnetic beam separator 906 and objective lens 908 for applying a primary beam 910 to a wafer 912 carried on an x-y stage 915. Secondary electrons from wafer 912 pass through beam separator 906, sector 914, and focusing and deflecting elements 200 to detector 220. The signals from detector 220 are supplied to imaging electronics 920.

Wafer 912 and stage 915 are contained in a vacuum chamber 922 supported on an isolation frame 924. Vacuum pumps 926 maintain a suitable vacuum in the chamber 922 and column 902 during operation. Wafer 912 is placed in and removed from chamber 922 by a wafer handler subsystem 928.

Wafer inspection system 900 is controlled by a computer system 930 having a control processor, image processor and image memory, for example. Computer system 930 is in communication with a workstation 932 having input/output devices 934 such as a keyboard and a pointing device or other suitable devices permitting human interaction, and a display 936. Control processor 930 communicates via a bus 938 with control circuits such as PE-beam control 940 which regulates the primary-electron beam 910, SE optics control 942 which controls the focusing and deflection elements of column 902 to provide a suitable secondary-electron beam on detector 220, PE alignment and deflection control 944 which controls the application of primary beam 910 on wafer 912, vacuum pumps control 946 for controlling vacuum pumps 926, wafer voltage control 948, stage control 950, and handler control 952. Control processor 930 also receives imaging data via bus 938 from imaging electronics 920 for storage, processing and image analysis.

Figure 11:
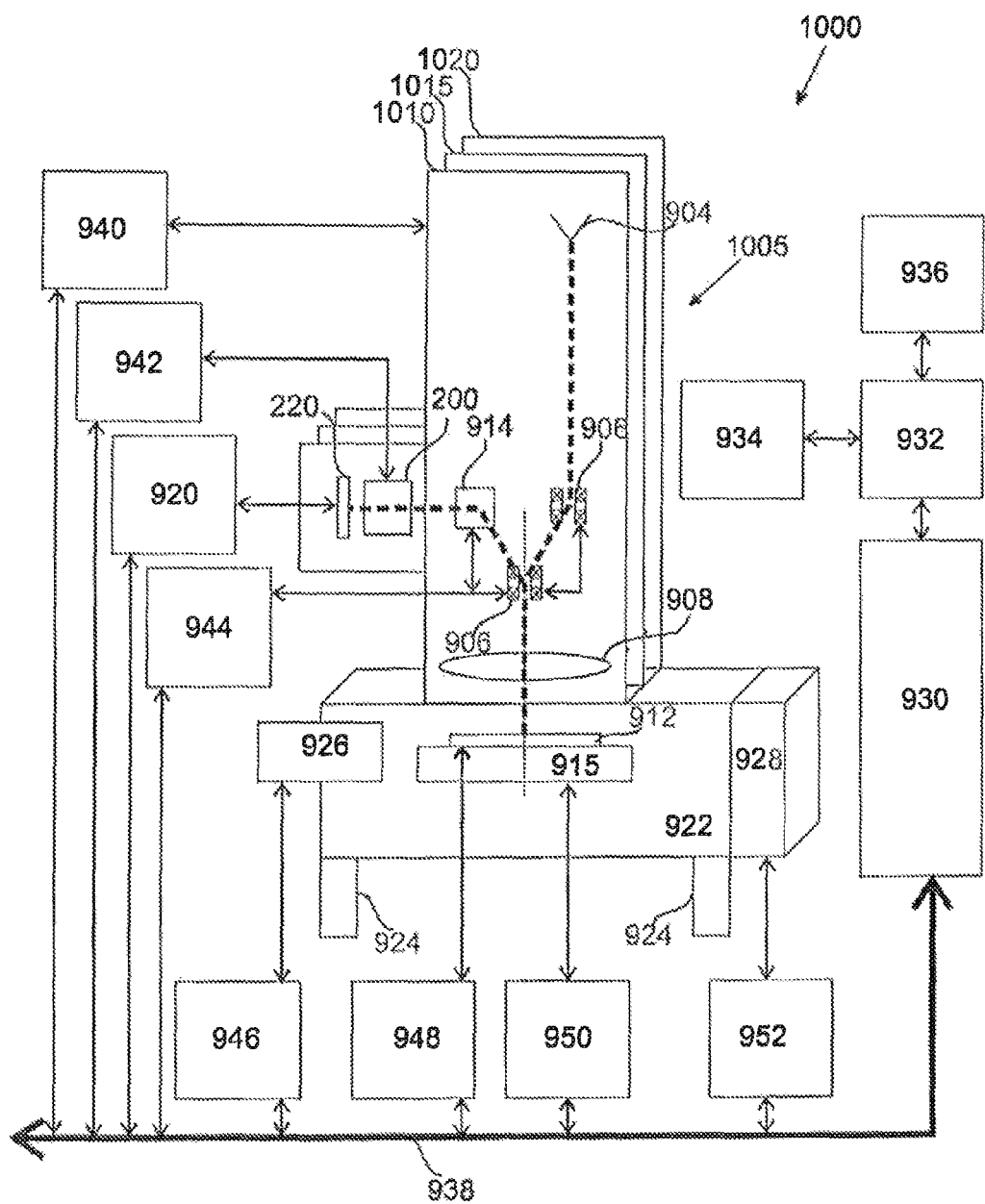
FIG. 11 shows a schematic side view of a charged particle multi-beam device according to embodiments described herein.

To provide for greater throughput than is possible with single-column system, multi-column systems are also contemplated. FIG. 11 shows schematically a multi-column e-beam wafer-inspection system 1000 having a row 1005 of e-beam columns 1010, 1015, 1020 to enable simultaneous inspection of multiple regions of a wafer 912.

Within FIG. 11, a multi-column device including three sub-units is shown. As will be understood by a person skilled in the art any suitable other number can be applied. For example 5, 10 or 15 electron beams can be arranged in a row.

Further, it is possible to position several rows next to each other. Thereby, an array of electron beams impinging on a specimen is realized. In order to have sufficient space for the separated charged particle beams, for example two rows can typically be arranged next to each other. Nevertheless, if no space-restrictions are present, 3, 5 or any other suitable number rows may be applied as well.

For arranging several sub-columns in a line, in an array or other pattern, some of the components, that usually are individually acting on a single electron beam in the case of a single-beam column, may be combined. Thus, one emitter array emits all electron beams or one objective lens focuses all beams of the multi-beam device. Examples are given in the following.

Figure 12:
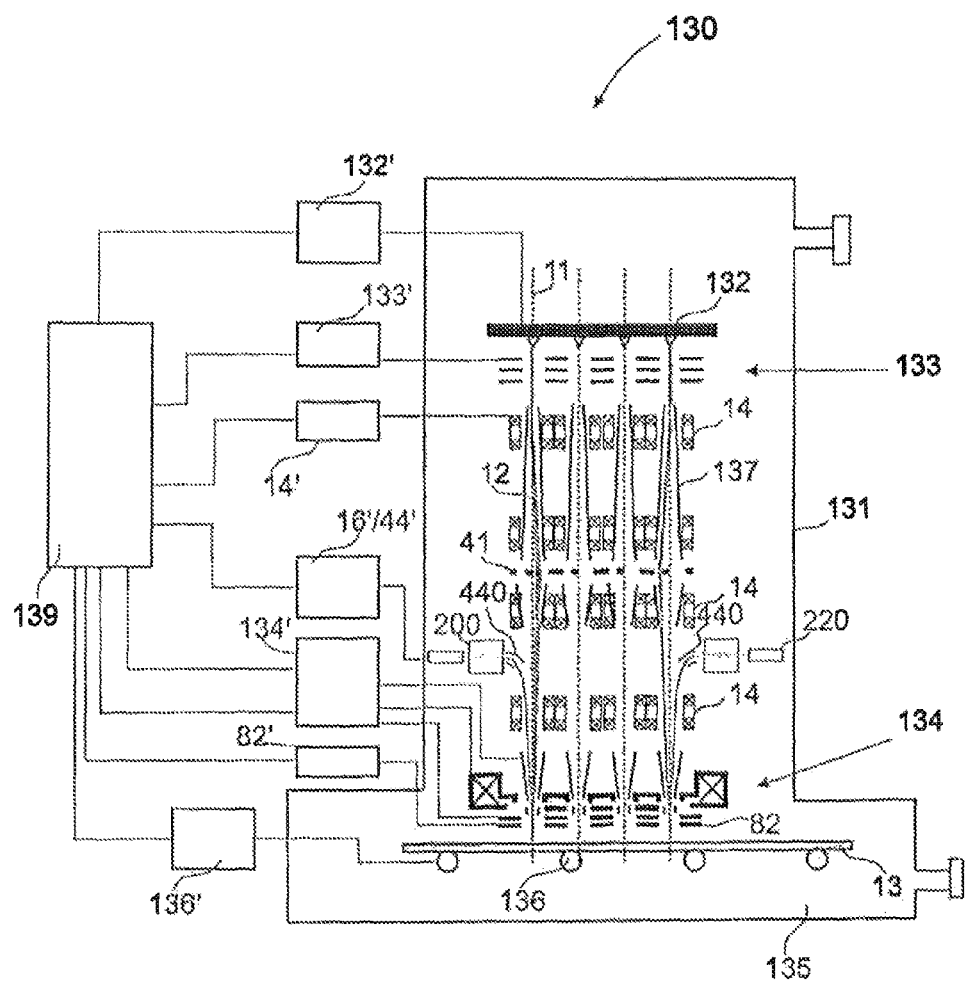
FIG. 12 shows a schematic side view of a charged particle multi-beam device according embodiments described herein.

A further embodiment arraying multiple beams is shown in FIG. 12. Therein, additionally multi-apertures are provided for each beam. Thus, different apertures can be selected using deflectors. Additional details relating to the selection of aperture openings of multi-apertures, as disclosed in European Application Nr. 03 00 6716 assigned to the same assignee as the present application, may also be utilized.

Device 130 has a housing 131 and a specimen chamber 135. The housing as well as the specimen chamber can be evacuated through vacuum ports. Within the specimen chamber, specimen 13 is located on specimen stage 136, which can move the specimen independently in two directions. For control of the specimen, movement control unit 136' is connected to specimen stage 136. Each of the four electron beams 12 has its own optical axis 11. The beams are emitted by an emitter array 132. The emitter array is controlled by control unit 132', that is, the beam current, the anode potential and a possible synchronization of the electron beams with the scanning over specimen 13 for each electron beam, respectively, is controlled. A multi-lens system 133 including an Einzel-lens module for each electron beam is used as a condenser lens for the four charged particle beams. The lens system 133 is controlled by control unit 133'. The control units can be connected to a common control 139.

Generally, without referring to the embodiment of FIG. 12, a single-beam or multi-beam column has typically at least two focusing elements for each primary electron beam. It is advantageous if the lenses (or at least one) are immersion lenses to allow the electron beam to be on a higher potential (beam boost potential) between the lenses. Further, according to one alternative, a combined gun-condenser lens is preferred for shaping the emitted beam.

For focusing the electron beams on specimen 13, a magnetic electrostatic compound lens 134 for all electron beams is used. Thereby, magnetic sub-lenses share a common excitation coil and for each electron beam an electrostatic sub-lens is integrated in the compound lens. The components of the magnetic electrostatic compound lens are controlled by control unit 134'.

Within FIG. 12, the electrostatic lens 133 and the magnetic electrostatic compound lens 134 are used exemplarily. Instead, two electrostatic-lenses could be used, namely as a condenser lens and as an objective lens. Alternatively, two magnetic electrostatic compound lenses could be used, namely as a condenser lens and as an objective lens. However, it is also possible that no condenser lens is required and only one multi-beam lens is used. Thereby, an electrostatic lens or a magnetic electrostatic compound lens could be used. Further, a proximity electrode 82 and a respective control unit 82' are provided, whereby an extraction field corresponding to each of the four electron beams is realized. Additionally, for each electron beam 12, electrodes 137 for providing a beam boost potential are provided. Beyond the above-mentioned components, a deflection-switch system is provided for each electron beam.

Contrary to the magnetic deflection systems shown in FIGS. 8A to 8D, the combination of 4 deflectors allows for an optical axis of the objective lens sub-units that is in common with the optical axis of the emitter sub-units. First deflection stages 14 deflect electron beams 12 to the left or to the right, depending on the kind of aperture used within aperture unit 41. For each electron beam, aperture unit 41 includes a large aperture for a high current measurement mode and a small aperture for a high resolution measurement mode.

Secondary electrons are separated from the primary electron beams by sectors 440, which are provided for each electron beam. The beam separation of the schematic drawing of FIG. 12 is illustrated within the plane of the figure. This is done for the sake of easier drawing only. Generally, the beam separation and thus, the arrangement of the detection units can also be realized in a dimension orthogonal to the plane of the figure.

For detection of the secondary electrons a focusing and deflection optics 200 is provided. All detection units are controlled by controller 16'/44', whereas each deflection stage 14 is controlled by control unit 14'.

While the foregoing is directed to embodiments of the invention, other and further embodiments of the invention may be devised without departing from the basic scope thereof, and the scope thereof is determined by the claims that follow.

The invention claimed is:

1. A secondary charged particle detection device for detection of a signal beam, comprising:
   a detector arrangement having at least two detection elements with active detection areas, wherein the active detection areas are separated by a gap; and
   a particle optics configured for separating the signal beam into a first portion of the signal beam and into at least one second portion of the signal beam, and configured for focusing the first portion of the signal beam and the at least one second portion of the signal beam, wherein the particle optics comprises an aperture plate having at least a first aperture opening in the aperture plate, and at least one second aperture opening in the aperture plate, wherein the first aperture opening has a concave shaped portion bended inwardly towards the center of the opening.

2. The detection device according to claim 1, wherein the first aperture opening has a pincushion shape.

3. The detection device according to claim 1, wherein the at least one second portion of the signal beam is a second, a third, a fourth and a fifth portion of the signal beam and the particles optics is configured for separating the signal beam in the first to fifth portion.

4. The detection device according to claim 1, wherein the at least one second aperture opening is at least one second radially outer aperture opening.

5. The detection device according claim 4, wherein the at least one second aperture opening is at least four outer aperture openings.

6. The detection device according to claim 1, wherein the second aperture opening has a perimeter with at least one straight boundary.

7. The detection device according to claim 6, wherein the straight boundary is provided by a division bar.

8. The detection device according to claim 1, wherein the particle optics further comprises:
   a focusing lens for focusing the signal beam through the first inner aperture opening.

9. The detection device according to claim 1, wherein the detector arrangement further comprises:
   a voltage supply connected to the aperture plate and configured for providing a deceleration potential.

10. The detection device according to claim 1, wherein the particle optics further comprises:
    a first deflection assembly for compensating dislocations of the signal beam introduced by scanning of a primary charged particle beam and for aligning the signal beam.

11. The detection device according to claim 1, wherein the thickness of the aperture plate is 5 mm or above.

12. The detection device according to claim 1, wherein the detection elements are PIN diodes having an active detection area of 1 mm$^2$ or below.

13. The detection device according to claim 1, wherein the detector arrangement is configured to have detection elements providing a 45° angular resolution by providing at least 8 detection elements.

14. A charged particle beam device, comprising:
    a charged particle beam source for providing a primary charged particle beam;
    a first focusing element for focusing the primary charged particle beam on the specimen, wherein a signal beam is generated; and
    a charged particle detection device for detection of a signal beam, comprising:
       a detector arrangement having at least two detection elements with active detection areas, wherein the active detection areas are separated by a gap;
       a particle optics configured for separating the signal beam into a first portion of the signal beam and into at least one second portion of the signal beam, and configured for focusing the first portion of the signal beam and the at least one second portion of the signal beam, wherein the particle optics comprises an aperture plate having at least a first aperture opening in the aperture plate, and at least one second aperture opening in the aperture plate, wherein the first aperture opening has a concave shaped portion bended inwardly towards the center of the opening.

15. The charged particle multi-beam device of claim 14, comprising at least two of the charged particle beam source, at least two of the first focusing element, and at least two of the charged particle detection device.

16. A method of operating a detection device, the method comprising:
    biasing an aperture plate of a particle optics, wherein the particle optics includes at least a first aperture opening in the aperture plate, and at least one second aperture opening in the aperture plate, wherein the aperture plate is biased such that one potential is surrounding the first aperture opening and wherein the first aperture opening has a concave shaped portion bended inwardly towards the center of the opening;

detecting a signal beam with a detector assembly having at least one detection element corresponding to the first aperture opening and at least one detection element corresponding to the at least one second aperture opening.

17. The method according to claim 16, wherein the detecting is conducted with a bandwidth of 1 GHz or above.

18. The method according to claim 16, the method further comprising focusing the signal beam.

19. The detection device according to claim 10, wherein the particle optics further comprises a second deflection assembly for compensation dislocations of the signal beam introduced by scanning of a primary charged particle beam and for aligning the signal beam.

20. The method according to claim 16, wherein the first aperture opening has a pincushion shape.

\* \* \* \* \*

UNITED STATES PATENT AND TRADEMARK OFFICE
CERTIFICATE OF CORRECTION

PATENT NO. : 8,963,083 B2  
APPLICATION NO. : 13/960393  
DATED : February 24, 2015  
INVENTOR(S) : Firnkes et al.

It is certified that error appears in the above-identified patent and that said Letters Patent is hereby corrected as shown below:

In the Specification

Column 16, Line 9, please delete "μm×50" and insert -- μm × 50 -- therefor.

Signed and Sealed this
Twenty-first Day of July, 2015

Michelle K. Lee
*Director of the United States Patent and Trademark Office*